United States Patent
Morimoto et al.

(10) Patent No.: US 6,442,704 B1
(45) Date of Patent: Aug. 27, 2002

(54) RING OSCILLATOR CLOCK FREQUENCY MEASURING METHOD, RING OSCILLATOR CLOCK FREQUENCY MEASURING CIRCUIT, AND MICROCOMPUTER

(75) Inventors: Yasufumi Morimoto; Takeshi Fujii, both of Hyogo (JP)

(73) Assignees: Mitsubishi Electric System LSI Design Corporation, Itami; Mitsubishi Denki Kabushiki Kaisha, Tokyo, both of (JP)

( * ) Notice: Subject to any disclaimer, the term of this patent is extended or adjusted under 35 U.S.C. 154(b) by 0 days.

(21) Appl. No.: 09/440,657

(22) Filed: Nov. 16, 1999

(30) Foreign Application Priority Data

Jun. 29, 1999 (JP) .......................... 11-184279

(51) Int. Cl.[7] .............................................. G06F 1/04
(52) U.S. Cl. .................................................... 713/500
(58) Field of Search ................................ 713/500, 502

(56) References Cited

U.S. PATENT DOCUMENTS 5,329,188 A * 7/1994 Sikkink et al. ................ 327/18
5,406,228 A * 4/1995 Hoang ......................... 331/1 A
5,915,108 A * 6/1999 Frey et al. ..................... 713/500
6,160,755 A * 12/2000 Norman et al. ............... 365/233

FOREIGN PATENT DOCUMENTS

JP 58-219625 12/1983
JP 8-316826 11/1996

* cited by examiner

*Primary Examiner*—Dennis M. Butler
(74) *Attorney, Agent, or Firm*—Burns, Doane, Swecker & Mathis, LLP

(57) ABSTRACT

A ring oscillator clock frequency measuring circuit includes a reference clock count timer and a ring oscillator clock count timer. The reference clock count timer starts its counting of a reference clock signal in response to a start instruction fed from a CPU, and outputs an overflow signal when its counting reaches a preset value. The ring oscillator clock count timer starts its counting of pulses of a ring oscillator clock signal in response to the start instruction fed from the CPU, and continues its counting until the reference clock count timer generates the overflow signal. The frequency of the ring oscillator clock signal is obtained from the count value of the ring oscillator clock count timer. This makes it possible to measure the frequency of the ring oscillator clock signal at high accuracy, and to reduce the current consumption by operating the CPU based on the ring oscillator clock signal after the measurement.

6 Claims, 3 Drawing Sheets

RING OSCILLATOR CLOCK FREQUENCY MEASURING METHOD, RING OSCILLATOR CLOCK FREQUENCY MEASURING CIRCUIT, AND MICROCOMPUTER

BACKGROUND OF THE INVENTION

1. Field of the Invention

The present invention relates to a ring oscillator clock frequency measuring method, and a ring oscillator clock frequency measuring circuit for measuring the frequency of a ring oscillator clock signal generated by a ring oscillator (square pulse generator), and to a microprocessor operating based on the ring oscillator clock signal.

2. Description of Related Art

A pulse train generated by a ring oscillator has large frequency fluctuations due to external factors such as temperature and process parameter, and hence an external oscillator like a ceramic oscillator is needed by a system requiring high frequency accuracy. Thus, a conventional system requiring high frequency accuracy cannot use a ring oscillator clock signal, but employs an external oscillator with greater current consumption than the ring oscillator.

Japanese patent application laid-open No. 58219625/1983 discloses techniques about such conventional ring oscillator clock frequency measurement and a microprocessor. FIG. 5 is a timing chart illustrating generation of a conventional ring oscillator clock signal clock count timer starting its counting in response to the start instruction, halting the counting in response to the overflow signal output from the reference clock count timer, and outputting a count value obtained during a time interval from the start to the halt of the counting.

According to a third aspect of the present invention, there is provided a microprocessor comprising: a ring oscillator pulse generator for generating a ring oscillator clock signal used by a microprocessor as its clock pulse train; a reference clock count timer for counting a number pulses of a reference clock signal generated by a reference clock generator installed outside the microprocessor, the reference clock count timer starting its counting by a start instruction, and outputting an overflow signal when the counting proceeds to a preset value; a first ring oscillator clock count timer for counting a number of pulses of a ring oscillator clock signal supplied from the ring oscillator pulse generator, the first ring oscillator clock count timer starting its counting in response to the start instruction, halting its counting in response to the overflow signal supplied from the reference clock count timer, and outputting a count value during a time interval from the start to the halt of the counting; a second ring oscillator clock count timer for counting a number of pulses of the ring oscillator clock signal generated by the ring oscillator pulse generator, the second ring oscillator clock count timer starting its down-counting when the count value of the first ring oscillator clock count timer is set to the second ring oscillator clock count timer, and outputting an overflow signal when its down-counting proceeds to zero; and a CPU for having the reference clock generator halt generating the reference clock signal in response to the overflow signal supplied from the reference clock count timer, for having the reference clock generator to restart generating the reference clock signal in response to the overflow signal supplied from the second ring oscillator clock count timer, and for supplying the start instruction to the reference clock count timer and the first ring oscillator clock count timer.

The present invention differs from the conventional ring oscillator clock signal generation disclosed in the foregoing Japanese patent application laid-open No. 58-219625/1983 in that it counts pulses of the ring oscillator clock signal for a fixed time interval defined by the reference clock signal, and then operates a microprocessor only by the ring oscillator clock signal thereafter whose frequency is known by the microprocessor.

The present invention differs from the conventional ring oscillator clock signal generation disclosed in the foregoing Japanese patent application laid-open No. 8316826/1996 in that the present invention improves the frequency accuracy by measuring the frequency of the ring oscillator clock signal, and by operating the microprocessor based on the ring oscillator clock signal whose frequency is known (but not regulated).

DETAILED DESCRIPTION OF THE PREFERRED EMBODIMENTS

The invention will now be described with reference to the accompanying drawings.

EMBODIMENT 1

Figure 1:
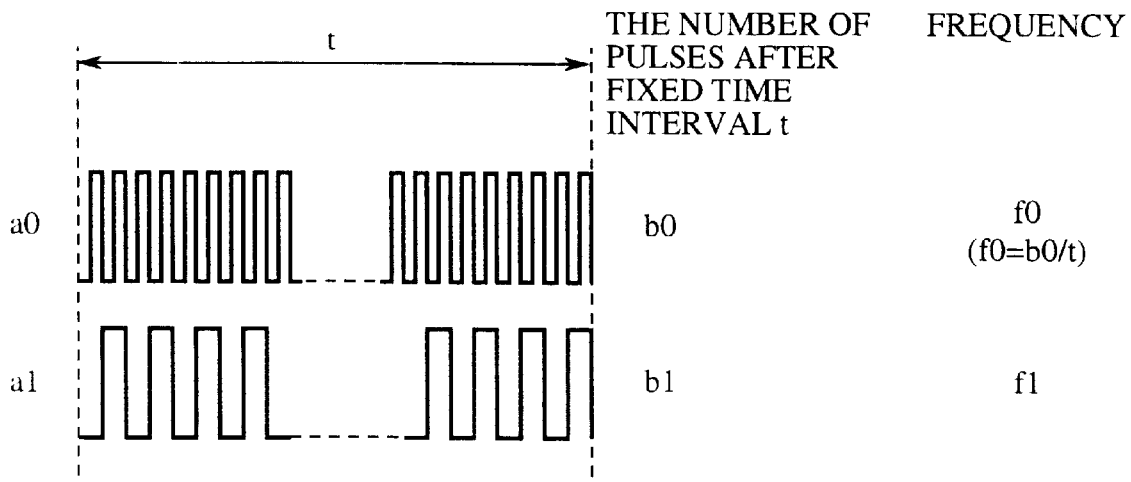
FIG. 1 is a timing chart illustrating a principle of a ring oscillator clock frequency-measuring method of an embodiment 1 in accordance with the present invention.

FIG. 1 illustrates a principle of the ring oscillator clock signal frequency measurement of an embodiment 1 in accordance with the present invention. In FIG. 1, the symbol $a0$ designates the output pulse train of an external reference clock generator, and $a1$ designates the output pulse train of a ring oscillator. The symbol $t$ designates a fixed time interval in which the frequency is measured, $b0$ designates the number of pulses of the reference clock signal during the fixed time interval $t$, and $b1$ designates the number of pulses of the ring oscillator clock signal during the fixed time interval $t$. The symbol $f0$ designates the frequency of the reference clock signal, and $f1$ designates the frequency of the ring oscillator clock signal.

Here, the relationship between the reference clock signal frequency $f0$ and the ring oscillator clock signal frequency $f1$ is expressed by the following equation (1)

$$f1 = f0 \times b1/b0 \qquad (1)$$

Thus counting the number $b1$ of the output pulses of the ring oscillator during the fixed time interval $t$, and comparing it with the number $b0$ of the output pulses of the reference clock generator such as an external ceramic oscillator whose frequency $f0$ is constant makes it possible to measure the ring oscillator clock signal frequency $f1$ at high accuracy.

For example, when the reference clock signal frequency $f0$ is 1 MHZ, the number $b0$ of pulses of the reference clock signal during the fixed time interval $t=1$ ms is $b0=1000$. Then, if the pulse count value $b1$ of the ring oscillator clock signal during the fixed time interval t=1 ms is b1=100, the ring oscillator clock signal frequency f1 is given by the following equation.

$$f1=1 \text{ (MHZ)} \times 100/1000=100 \text{ (kHz)}$$

Figure 2:
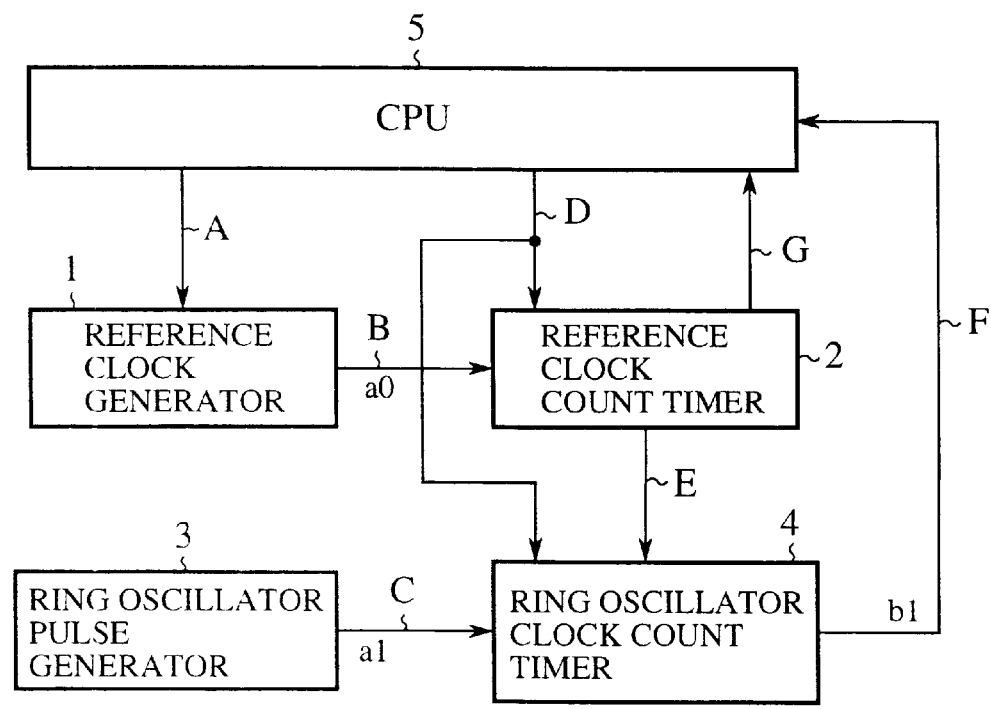
FIG. 2 is a block diagram showing a ring oscillator clock frequency measuring circuit of the embodiment 1 in accordance with the present invention.

FIG. 2 is a block diagram showing a ring oscillator clock frequency measuring circuit of the present embodiment 1 for measuring the frequency of the ring oscillator clock signal based on the principle as described above in connection with FIG. 1. In FIG. 2, the reference numeral 1 designates a reference clock generator for generating a reference clock signal. It consists of a ceramic oscillator or crystal oscillator that is externally connected to a microprocessor. It starts to generate the reference clock signal when a start instruction is supplied from a CPU 5 through a signal line A, outputs the reference clock signal through the signal line B, and stops generating the reference clock signal when a stop instruction is supplied through the signal line A. The reference numeral 2 designates a reference clock count timer. It starts, when a start instruction is supplied from the CPU 5 through a signal line D, counting the reference clock signal supplied through the signal line B, counts it until the count value reaches a predetermined number, and outputs an overflow signal through signal lines E and G. The reference numeral 3 designates a ring oscillator pulse generator for outputting a ring oscillator clock signal through a signal line C. The reference numeral 4 designates a ring oscillator clock count timer for counting the ring oscillator clock signal supplied from the signal line C in response to the start instruction supplied from the CPU 5 through the signal line D. It stops counting in response to the overflow signal fed from the reference clock count timer 2 through the signal line E, and outputs through a data bus F the count value b1 counted during that interval. The reference numeral 5 designates the CPU for supplying the start/stop instruction to the reference clock generator 1 through the signal line A, for supplying the start instruction of the timers 2 and 4 through the signal line D, and for obtaining the frequency of the ring oscillator clock signal from the count value b1 fed through the data bus F.

Next, the operation of the present embodiment 1 will be described.

Receiving the start instruction from the CPU 5 through the signal line A, the reference clock generator 1 starts its operation, and outputs the reference clock signal through the signal line B. At about the same time (specifically, a time at which the reference clock signal becomes stable), the CPU 5 supplies the reference clock count timer 2 and ring oscillator clock count timer 4 with the start instruction through the signal line D.

Receiving the start instruction, the reference clock count timer 2 starts to count the pulses of the reference clock signal a0, and the ring oscillator clock count timer 4 starts to count the pulses of the ring oscillator clock signal a1 at the same time. Here, a preset value b0 is set in the reference clock count timer 2 in advance. When the reference clock count timer 2 counts the reference clock signal up to the preset value b0, it completes its counting, and supplies the ring oscillator clock count timer 4 and the CPU 5 with the overflow signal through the signal line E and signal line G, respectively.

Receiving the overflow signal through the signal line G, the CPU 5 supplies the reference clock generator 1 with the stop signal through the signal line A, so that the reference clock generator 1 stops generating the reference clock signal in response to the stop signal. On the other hand, receiving the overflow signal through the signal line E, the ring oscillator clock count timer 4 stops counting the pulses of the ring oscillator clock signal supplied from the ring oscillator pulse generator 3. When the ring oscillator clock count timer 4 stops counting the pulses of the ring oscillator clock signal, it supplies the CPU 5 with the count value b1 at that time through the data bus F.

Receiving the count value b1 from the ring oscillator clock count timer 4, the CPU 5 calculates the frequency of the ring oscillator clock signal by equation (1). Specifically, the CPU 5 obtains the frequency of the ring oscillator clock signal by comparing the number of pulses b0 of the reference clock signal with the number of pulses b1 of the ring oscillator clock signal during the time interval t. Thus, the CPU 5 controls the operation of the microprocessor in accordance with the frequency obtained.

As described above, the present embodiment 1 counts the ring oscillator clock signal for the fixed time interval, and obtains the frequency of the ring oscillator clock signal by comparing the count value of the ring oscillator clock signal with that of the reference clock signal. This offers an advantage of being able to operate the microprocessor at high accuracy using the ring oscillator clock signal whose frequency is known, even in a system requiring high frequency accuracy.

EMBODIMENT 2

Figure 3:
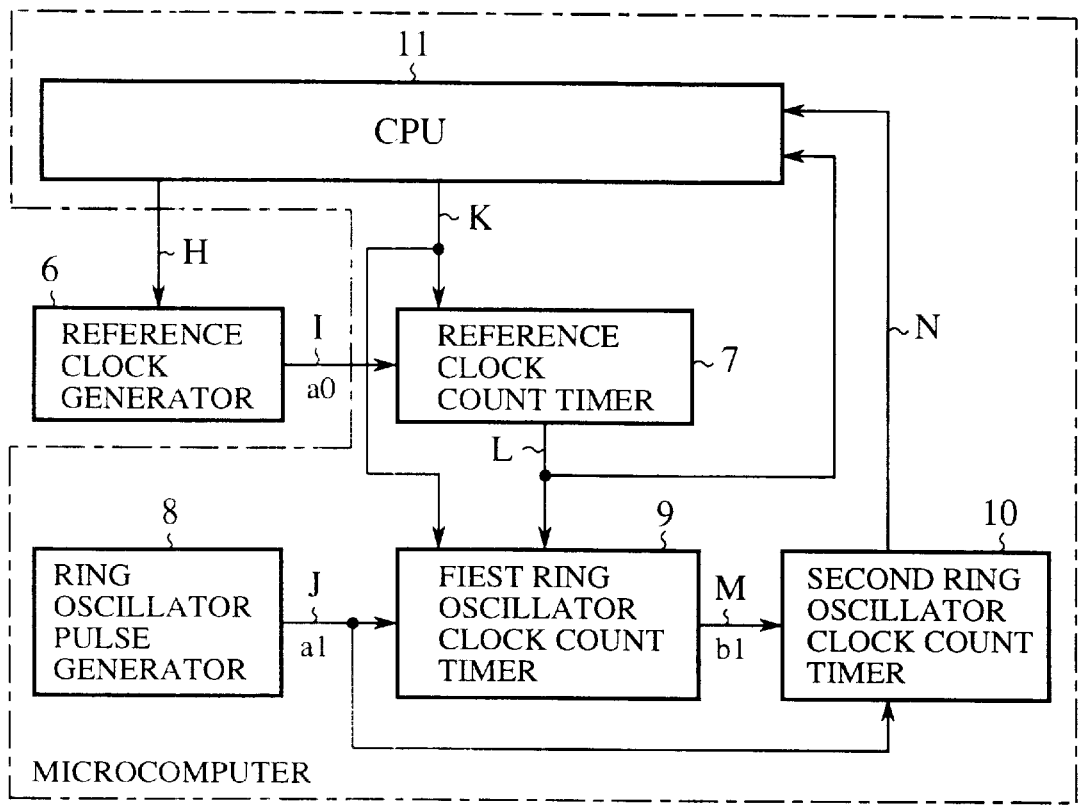
FIG. 3 is a block diagram showing a microprocessor of an embodiment 2 in accordance with the present invention.

FIG. 3 is a block diagram showing a microprocessor of an embodiment 2 in accordance with the present invention. In FIG. 3, the reference numeral 6 designates a reference clock generator that consists of a ceramic oscillator, or the like externally connected to the microprocessor it outputs a reference clock signal a0 through a signal line I in response to a start instruction supplied from a CPU 11 through a signal line H, and stops generating the reference clock signal a0 in response to a stop instruction. The reference numeral 7 designates a reference clock count timer that starts counting the reference clock signal supplied through the signal line I in response to a start instruction fed from the CPU 11 through a signal line K, and outputs an overflow signal through a signal line L when it counts the reference clock signal up to a preset value. The reference numeral 8 designates a ring oscillator pulse generator for outputting a ring oscillator clock signal a1 through a signal line J. These components are the same as their counterparts of the foregoing embodiment 1 as shown in FIG. 2, that is, the reference clock generator 1, reference clock count timer 2 and ring oscillator pulse generator 3.

The reference numeral 9 designates a first ring oscillator clock count timer corresponding to the ring oscillator clock count timer 4 of the foregoing embodiment 1 as shown in FIG. 2. It up-counts from zero the ring oscillator clock signal a1 fed from the ring oscillator pulse generator 8 through the signal line J in response to the start instruction supplied from the CPU 11 through the signal line K, stops its counting in response to the overflow signal fed from the reference clock count timer 7 through the signal line L, and outputs a resultant count value b1 through a data bus M. The reference numeral 10 designates a second ring oscillator clock count timer, to which the count value b1 is set which is fed from the first ring oscillator clock count timer 9 through the data bus M. It down-counts from the set value b1 the ring oscillator clock signal supplied through the signal line J, and outputs an overflow signal through a signal line N when the count value becomes zero.

The reference numeral 11 designates the CPU of the microprocessor. It supplies the reference clock count timer 7 and first ring oscillator clock count timer 9 with the start instruction through the signal line K. It also supplies the reference clock generator 6 with the stop instruction through the signal line H in response to the overflow signal supplied from the reference clock count timer 7 through the signal line L, and with the start instruction through the signal line H in response to the overflow signal supplied from the second ring oscillator clock count timer 10 through the signal line N.

Next, the operation of the present embodiment 2 will be described.

Receiving the start instruction from the CPU 11 through the signal line H, the reference clock generator 6 starts to generate the reference clock signal a0, and outputs it through the signal line I. At about the same time (specifically, the time at which the reference clock signal a0 on the signal line I becomes stable), the CPU 11 supplies the reference clock count timer 7 and first ring oscillator clock count timer 9 with the start instruction through the signal line K. Receiving the start instruction, the reference clock count timer 7 starts to count the pulses of the reference clock signal a0, and the first ring oscillator clock count timer 9 starts to count the pulses of the ring oscillator clock signal all at the same time. In this case, the reference clock count timer 7 is set at a preset value b0 in advance, so that when its count value reaches the preset value b0, it supplies the overflow signal to the first ring oscillator clock count timer 9 and CPU 11 through the signal line L.

Receiving the overflow signal through the signal line L, the CPU 11 supplies the stop signal to the reference clock generator 6 through the signal line H, so that the reference clock generator 6 stops generating the reference clock signal. The first ring oscillator clock count timer 9, on the other hand, stops counting the ring oscillator clock signal a1 fed from the ring oscillator pulse generator 8 in response to the overflow signal supplied through the signal line L. The first ring oscillator clock count timer 9, which stops counting the ring oscillator clock signal, sets the count value b1 at that time to the second ring oscillator clock count timer 10 through the data bus M. In response to the count value b1 set through the data bus M, the second ring oscillator clock count timer 10 starts to down-count, from the set value b1 to zero, the ring oscillator clock signal supplied from the ring oscillator pulse generator 8 through the signal line J.

Thus, the second ring oscillator clock count timer 10 carries out its counting after the count value b1 of the first ring oscillator clock count timer 9 is set. This makes it possible to set a time interval t1 counted by the second ring oscillator clock count timer 10 at about the same interval as a time interval to counted by the first ring oscillator clock count timer 9. In that interval t1, the reference clock signal a0 is halted, so that the microprocessor operates based on the ring oscillator clock signal a1 with the frequency f1.

The second ring oscillator clock count timer 10 completes its counting when the count value reaches zero, and outputs the overflow signal through the signal line N. Receiving the overflow signal through the signal line N, the CPU 11 supplies the reference clock generator 6 with the start signal through the signal line H. In response to the start signal, the reference clock generator 6 restarts the generation of the reference clock signal. At the same time, the CPU 11 outputs the start signal through the signal line K. In response to the start signal, the reference clock count timer 7 restarts to count the reference clock signal a0 up to the set value b0, and the first ring oscillator clock count timer 9 restarts to count the ring oscillator clock signal a1. When the reference clock count timer 7 counts the preset value b0, it completes its counting and outputs the overflow signal through the signal line L. In response to the overflow signal, the first ring oscillator clock count timer 9 halts counting, and supplies the count value b1 at that time to the second ring oscillator clock count timer 10 through the data bus M.

Thus, the frequency of the ring oscillator clock signal is measured at every fixed time interval by repeating the foregoing operation. This makes it possible for the microprocessor to carry out its operation in accordance with the intermittent operation of the reference clock generator 6.

Thus, the microprocessor of the present embodiment 2 freed the CPU 11 from the need for calculating the frequency by supplying the count value of the first ring oscillator clock count timer 9 not to the CPU 11 but to the second ring oscillator clock count timer 10, thereby reducing the load of the CPU 11.

Figure 4:
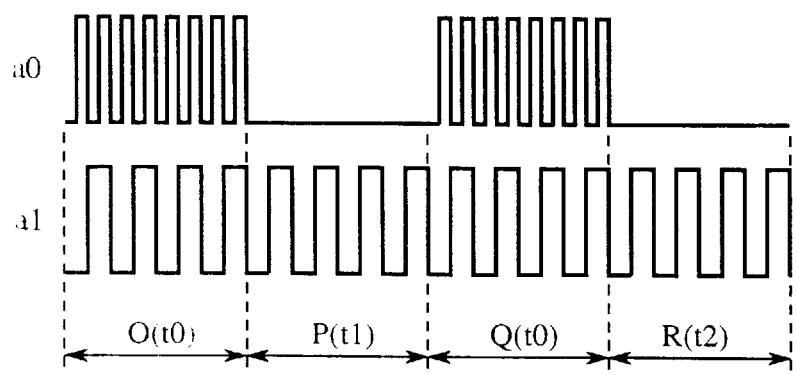
FIG. 4 is a timing chart illustrating an operation of the microprocessor of the embodiment 2.
Figure 5:
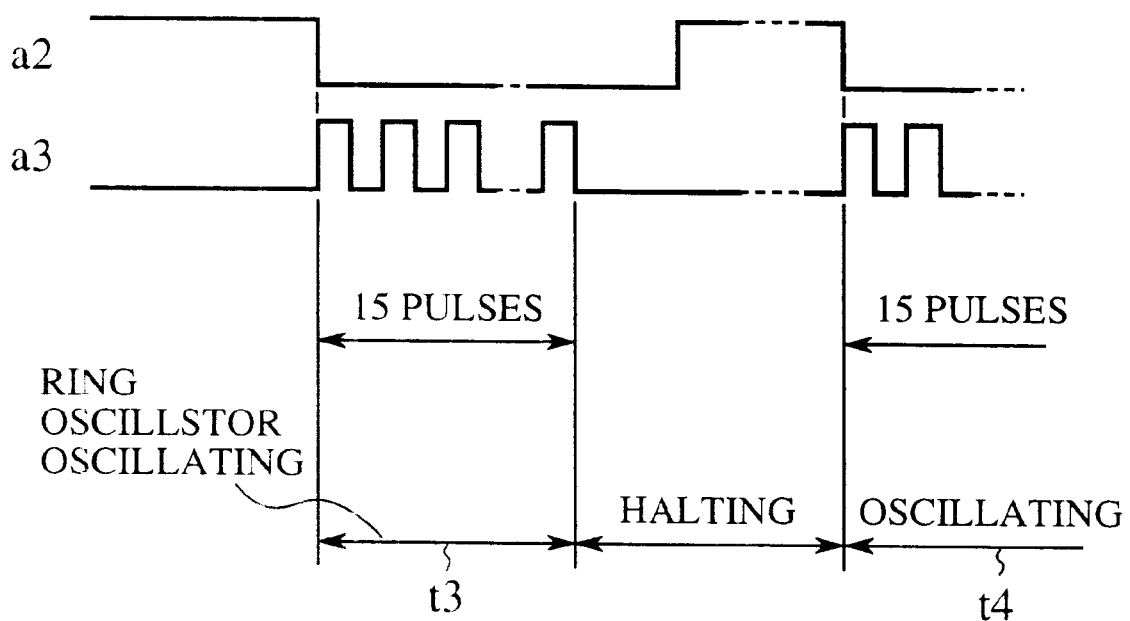
FIG. 5 is a timing chart illustrating an example of the generation of a conventional ring oscillator clock signal.

The operation of the microprocessor in accordance with the present embodiment 2 will now be described in more detail with reference to FIG. 4. FIG. 4 is a timing chart of the reference clock signal a0 and ring oscillator clock signal a1 when the microprocessor operates in the circuit as shown in FIG. 3. In FIG. 4, the symbol 0 designates a section associated with the time interval t0 during which the frequency of the ring oscillator clock signal is measured (and the microprocessor operates based on the ring oscillator clock signal), and P designates a section associated with the time interval t1 during which the microprocessor operates based on the frequency of the ring oscillator clock signal measured during the section 0. The symbol Q designates a section associated with the time interval t0 during which the frequency of the ring oscillator clock signal is measured (and the microprocessor operates based on the frequency of the ring oscillator clock signal), and R designates a section associated with the time interval t1 during which the microprocessor operates based on the frequency of the ring oscillator clock signal measured during the section Q. The reference clock generator 6 halts its operation in the sections P and R.

The count value b1 of the ring oscillator clock signal during the time interval t0 in the section 0 is set in the time interval t1 in the next section P. Likewise, the count value b1 of the ring oscillator clock signal during the time interval t0 in the section Q is set in the time interval t2 in the next section R. This makes it possible to set the time intervals t1 and t2 in the sections 0 and Q at the time interval t0 independently of the frequency of the ring oscillator clock signal.

The microprocessor also operates based on that ring oscillator clock signal a1 in the sections 0 and Q.

Thus repeating the intermittent ring oscillator clock frequency measurement makes it possible to obtain, even if the frequency fluctuates, the information about the frequency fluctuations after the frequency measurement. This makes it possible for the microprocessor to correct the frequency fluctuations of the ring oscillator clock signal at every fixed time interval in accordance with the measured result, and hence to achieve stable operation.

Thus, according to the present embodiment 2, the reference clock signal is provided with a wait time. This offers an advantage of being able to implement the reduction in the current consumption during the operation of the microprocessor.

What is claimed is:

1. A ring oscillator clock frequency measuring method to control a reference clock for microprocessor, comprising the steps of:

counting, during a same time interval, a number of pulses of a reference clock signal externally supplied and a number of pulses of a ring oscillator clock signal output from a ring oscillator; and obtaining a frequency of the ring oscillator clock signal by comparing the number of pulses of the ring oscillator clock signal with the number of pulses of the reference clock signal.

2. A ring oscillator frequency measuring circuit to control a reference clock for microprocessor, comprising:

a reference clock count timer for counting a number of pulses of a reference clock signal generated by a reference clock generator, said reference clock count timer starting its counting in response to a start instruction, and outputting an overflow signal when the counting proceeds to a preset value; and a ring oscillator clock counter timer for counting a number of pulses of a ring oscillator clock signal generated by a ring oscillator pulse generator, said ring oscillator clock count timer starting its counting in response to the start instruction, halting the counting in response to the overflow signal output from said reference clock count timer, and outputting a count value obtained during a time interval from the start to the half of the counting.

3. A microprocessor comprising:

a ring oscillator pulse generator for generating a ring oscillator clock signal used by a microprocessor as its clock pulse train;

a reference clock count timer for counting a number pulses of a reference clock signal generated by a reference clock generator installed outside said microprocessor said reference clock count timer starting its counting by a start instruction, and outputting an overflow signal when the counting proceeds to a preset value;

a first ring oscillator clock count timer for counting a number of pulses of a ring oscillator clock signal supplied from said ring oscillator pulse generator, said first ring oscillator clock count timer starting its counting in response to the start instruction, halting its counting in response to the overflow signal supplied from said reference clock count timer, and outputting a count value during a time interval from the start to the halt of the counting;

a second ring oscillator clock count timer for counting a number of pulses of the ring oscillator clock signal generated by said ring oscillator pulse generator, said second ring oscillator clock count timer starting its down-counting when the count value of said first ring oscillator clock count timer is set to said second ring oscillator clock count timer, and outputting an overflow signal when its down-counting proceeds to zero; and a CPU for having said reference clock generator halt generating the reference clock signal in response to the overflow signal supplied from said reference clock count timer, for having said reference clock generator to restart generating the reference clock signal in response to the overflow signal supplied from said second ring oscillator clock count timer, and for supplying the start instruction to said reference clock count timer and said first ring oscillator clock count timer.

4. A method of controlling a computer, said method comprising the steps of:

counting a number of pulses of an externally supplied reference clock signal;

counting, during a same time interval as the reference clock signal counting step, a number of pulses of a ring oscillator clock signal output from a ring oscillator;

obtaining a frequency of the ring oscillator clock signal by comparing the number of pulses of the ring oscillator clock signal with the number of pulses of the reference clock signal; and controlling the operation of a computer using the obtained frequency of the ring oscillator.

5. A microprocessor controlled with a reference clock generated by a ring oscillator, wherein said reference clock is regulated by a ring oscillator clock frequency measuring circuit comprising:

a ring oscillator pulse generator for generating a ring oscillator clock signal;

a reference clock counter timer for counting a number of pulses of a reference clock signal supplied from outside;

a ring oscillator clock count timer for counting a number of pulses of said ring oscillator clock signal supplied from said ring oscillator pulse generator, said ring oscillator clock count timer counting during a same time interval as said reference clock count timer; and a CPU for calculating a frequency of said ring oscillator clock signal by comparing the number of pulses of said ring oscillator clock signal with the number of pulses of said reference clock signal.

6. A method of measuring a frequency of a ring oscillator, comprising the steps of:

generating in a ring oscillator pulse generator a ring oscillator clock signal used by a computer as its clock pulse train;

counting in a reference clock counter a number pulses of a reference clock signal generated by a reference clock generator installed outside said computer, said reference clock counter starting its counting by a start instruction, and outputting an overflow signal when the counting proceeds to a preset value;

counting in a first ring oscillator clock counter a number of pulses of said ring oscillator clock signal supplied from said ring oscillator pulse generator, said first ring oscillator clock counter starting its counting in response to the start instruction, halting its counting in response to the overflow signal supplied from said reference clock counter, and outputting a count value during a time interval from the start to the halt of the counting;

counting in a second ring oscillator clock counter a number of pulses of the ring oscillator clock signal generated by said ring oscillator pulse generator, said second ring oscillator clock counter starting its down-counting when the count value of said first ring oscillator clock counter is set to said second ring oscillator clock counter, and outputting an overflow signal when its down-counting proceeds to zero; and generating in a CPU a signal to halt said reference clock generator from generating the reference clock signal in response to the overflow signal supplied from said reference clock count timer, generating a signal to have said reference clock generator restart generating the reference clock signal in response to the overflow signal supplied from said second ring oscillator clock count timer, and supplying the start instruction to said reference clock count timer and said first ring oscillator clock count timer.

* * * * *